(12) United States Patent
Hayata et al.

(10) Patent No.: US 12,374,650 B2
(45) Date of Patent: Jul. 29, 2025

(54) MANUFACTURING APPARATUS AND MANUFACTURING METHOD OF SEMICONDUCTOR DEVICE

(71) Applicant: SHINKAWA LTD., Tokyo (JP)

(72) Inventors: Shigeru Hayata, Tokyo (JP); Osamu Kakutani, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 17/921,618

(22) PCT Filed: Jul. 6, 2021

(86) PCT No.: PCT/JP2021/025429
§ 371 (c)(1),
(2) Date: Oct. 26, 2022

(87) PCT Pub. No.: WO2023/281623
PCT Pub. Date: Jan. 12, 2023

(65) Prior Publication Data
US 2024/0105672 A1 Mar. 28, 2024

(51) Int. Cl.
*H01L 23/00* (2006.01)
(52) U.S. Cl.
CPC ........... *H01L 24/78* (2013.01); *H01L 24/85* (2013.01); *H01L 2224/78001* (2013.01);
(Continued)
(58) Field of Classification Search
CPC ............ H01L 24/78; H01L 24/85; H01L 2224/78001; H01L 2224/78304; H01L 2224/78353; H01L 2224/78702; H01L 2224/78753; H01L 2224/85123; H01L 2224/8518; H01L 2224/859;
(Continued)

(56) References Cited

U.S. PATENT DOCUMENTS 6,449,516 B1 9/2002 Kyomasu et al.
6,464,126 B2 10/2002 Hayata et al.
(Continued)

FOREIGN PATENT DOCUMENTS

JP 2000021923 1/2000
JP 2002261114 9/2002
(Continued)

OTHER PUBLICATIONS

"International Search Report (Form PCT/ISA/210) of PCT/JP2021/025429", mailed on Sep. 21, 2021, pp. 1-3.

*Primary Examiner* — Ermias T Woldegeorgis
(74) *Attorney, Agent, or Firm* — JCIPRNET

(57) ABSTRACT

A wire bonding apparatus includes: a capillary, performing predetermined processing on a workpiece and movable with respect to the workpiece; an optical mechanism, moving together with the capillary; and a controller. The optical mechanism includes: a first imaging unit, acquiring a first image obtained by imaging a standard point set within an imaging range; and a second imaging unit, acquiring a second image obtained by imaging a reference point formed at a predetermined distance from the capillary. The controller positions the capillary with respect to the workpiece based on the first image, and calculates a positioning correction amount of the capillary based on the second image.

10 Claims, 16 Drawing Sheets

(52) U.S. Cl.
CPC ............. *H01L 2224/78304* (2013.01); *H01L 2224/78353* (2013.01); *H01L 2224/78702* (2013.01); *H01L 2224/78753* (2013.01); *H01L 2224/85123* (2013.01); *H01L 2224/8518* (2013.01); *H01L 2224/859* (2013.01); *H01L 2924/40* (2013.01)

(58) Field of Classification Search
CPC ..... H01L 2924/40; H01L 24/48; H01L 21/60; H01L 2224/78; H01L 2224/78301
See application file for complete search history.

(56) References Cited

U.S. PATENT DOCUMENTS

| | | |
|---|---|---|
| 6,669,076 B2 | 12/2003 | Nogawa |
| 10,262,968 B2 | 4/2019 | Hayata et al. |
| 2004/0060663 A1* | 4/2004 | Haraguchi ........... B23K 20/005 382/145 |
| 2014/0138426 A1* | 5/2014 | Hagiwara ............... H01L 24/85 228/160 |

FOREIGN PATENT DOCUMENTS

| | | |
|---|---|---|
| JP | 3416091 | 6/2003 |
| WO | 2016158588 | 10/2016 |

\* cited by examiner

MANUFACTURING APPARATUS AND MANUFACTURING METHOD OF SEMICONDUCTOR DEVICE

CROSS-REFERENCE TO RELATED APPLICATION

This application is a 371 application of the International PCT application serial no. PCT/JP2021/025429, filed on Jul. 6, 2021. The entirety of the above-mentioned patent application is hereby incorporated by reference herein and made a part of this specification.

TECHNICAL FIELD

The present specification discloses a manufacturing apparatus and a manufacturing method for manufacturing a semiconductor device.

RELATED ART

A manufacturing apparatus of a semiconductor device, for example, a wire bonding apparatus or a die bonding apparatus, has a tool that performs predetermined processing on a workpiece. For example, the wire bonding apparatus that connects electrodes provided on the workpiece with a wire has, as the tool, a capillary through which the wire is inserted. In addition, the die bonding apparatus that bonds a semiconductor chip to a substrate being the workpiece has, as the tool, a collet that holds the semiconductor chip.

In order to suitably manufacture a semiconductor device, the tool needs to be accurately positioned with respect to the workpiece. Therefore, conventionally, there has been proposed to provide a camera that moves together with the tool. A part of the workpiece is imaged by the camera, and the tool is positioned based on an obtained image. That is, a relative positional relationship between the camera and the tool is stored in advance as a bonding offset. Then, a standard point provided on the workpiece is imaged by the camera, a relative positional relationship between the camera and the workpiece is specified based on an obtained image, and the specified relative positional relationship is combined with the known bonding offset. Thereby, the positional relationship of the tool relative to the workpiece can be specified.

PRIOR-ART DOCUMENTS

Patent Documents

Patent Document 1: Japanese Patent No. 3416091

SUMMARY OF THE INVENTION

Problems to be Solved by the Invention

However, the bonding offset deviates from an initial value due to a temperature variation or the like. When the bonding offset varies from the initial value, the positional relationship of the tool relative to the workpiece cannot be accurately calculated, and positioning accuracy of the tool deteriorates.

Therefore, conventionally, there has been proposed a technique for correcting a bonding offset. For example, Patent Document 1 discloses a bonding apparatus in which a reference member provided in a predetermined position is used and image light of a tool is guided to a positioning camera for imaging. The reference member has multiple optical members having a reflecting surface, and the image light of the tool close to one optical member is guided to the positioning camera. In Patent Document 1, an accurate bonding offset amount and thus an accurate positioning correction amount are calculated based on an image obtained by imaging the tool.

According to the technique as in Patent Document 1, the positioning correction amount can be accurately specified. However, in Patent Document 1, the reference member is fixed in the predetermined position away from the tool. Hence, in order to calculate the accurate bonding offset amount, it is necessary to temporarily suspend the processing on the workpiece and move the tool to the vicinity of the reference member. As a result, in the technique of Patent Document 1, task time for manufacturing a semiconductor device is increased.

As another technique, there has been proposed to provide a temperature sensor on a tool or a positioning camera and correct a bonding offset amount according to a measured temperature. However, a large number of members made of different materials are interposed between the tool and the positioning camera, and there are also multiple heat sources. Hence, a temperature distribution between the tool and the positioning camera varies in a complex manner, and accordingly, a change amount of the bonding offset also varies in a complex manner. Hence, it is difficult to accurately correct the positioning only by a detected temperature.

Therefore, the present specification discloses a manufacturing apparatus and a manufacturing method in which accuracy of the positioning correction amount can be relatively easily improved.

Means for Solving the Problems

A manufacturing apparatus of a semiconductor device disclosed in the present specification is characterized as follows. The manufacturing apparatus includes: a tool, performing predetermined processing on a workpiece and movable with respect to the workpiece; an optical mechanism, moving together with the tool; and a controller. The optical mechanism includes: a first imaging unit, acquiring a first image obtained by imaging a standard point set within an imaging range; and a second imaging unit, acquiring a second image obtained by imaging a reference point formed at a predetermined distance from the tool. The controller positions the tool with respect to the workpiece based on the first image, and calculates a positioning correction amount of the tool based on the second image.

In this case, the controller may store in advance a bonding offset, which is an offset between a first optical axis being an optical axis of the first imaging unit, and the tool. The controller may position the tool based on coordinates of the standard point in the first image and the bonding offset, and may calculate the positioning correction amount that cancels a change in the bonding offset based on a variation in coordinates of the reference point in the second image.

The first imaging unit and the second imaging unit may have an imaging element in common. The first imaging unit may include a first optical element group that guides a first field light being light from the standard point to the imaging element. The second imaging unit may include a second optical element group that guides a second field light being light from the reference point to the imaging element. A second optical path being an optical path of the second field light may join a first optical path being an optical path of the first field light at a junction located halfway from the reference point to the imaging element.

In this case, the first imaging unit may include a first illumination that illuminates the standard point. The second imaging unit may include a second illumination that illuminates the reference point. The controller may switch between the first illumination and the second illumination for lighting, thereby switching a field of view to be imaged by the imaging element.

An optical path length of the first optical path may be equal to an optical path length of the second optical path.

At least one of the first imaging unit and the second imaging unit may have one or more focus lenses disposed closer to an imaging target than the junction and adjusting a focus.

Among one or more optical elements constituting the first optical element group and one or more optical elements constituting the second optical element group, at least two optical elements may be bonded and integrated with each other.

The controller may execute imaging of the second image and calculation of the positioning correction amount during a period during which the tool is stopped or moves at low speed.

In this case, the tool may be a capillary through which a wire is inserted in a wire bonding apparatus that connects electrodes provided on the workpiece with the wire. The controller may execute the imaging of the second image and the calculation of the positioning correction amount during a discharge period during which discharging is performed in order to melt a tip of the wire, or during a search period during which the capillary is lowered at low speed in order to search for a height position where the tip of the wire contacts the electrodes.

The tool may be a capillary through which a wire is inserted in a wire bonding apparatus that connects electrodes provided on the workpiece with the wire. The manufacturing apparatus of a semiconductor device may further include: a horn, holding the capillary; and a clamper, provided on the horn and having a pair of arms that grip the wire passing through the capillary. The reference point may be a point on a surface of the horn and directly below a gap between the pair of arms.

A manufacturing method of a semiconductor device disclosed in the present specification is a manufacturing method of a semiconductor device that manufactures a semiconductor device by performing predetermined processing on a workpiece by a tool movable with respect to the workpiece. The manufacturing method is characterized by including the following steps. A standard point set within an imaging range is imaged and a first image is acquired by a first imaging unit movable together with the tool. A reference point formed at a predetermined distance from the tool is imaged and a second image is acquired by a second imaging unit movable together with the tool and the first imaging unit. The tool is positioned with respect to the workpiece based on the first image. A positioning correction amount of the tool is calculated based on the second image.

Effects of the Invention

According to the technique disclosed in the present specification, by the second imaging unit that moves together with the tool, the reference point is imaged, and the positioning correction amount is calculated based on the obtained second image. As a result, the accuracy of the positioning correction amount can be relatively easily improved.

DESCRIPTION OF THE EMBODIMENTS

Figure 1:
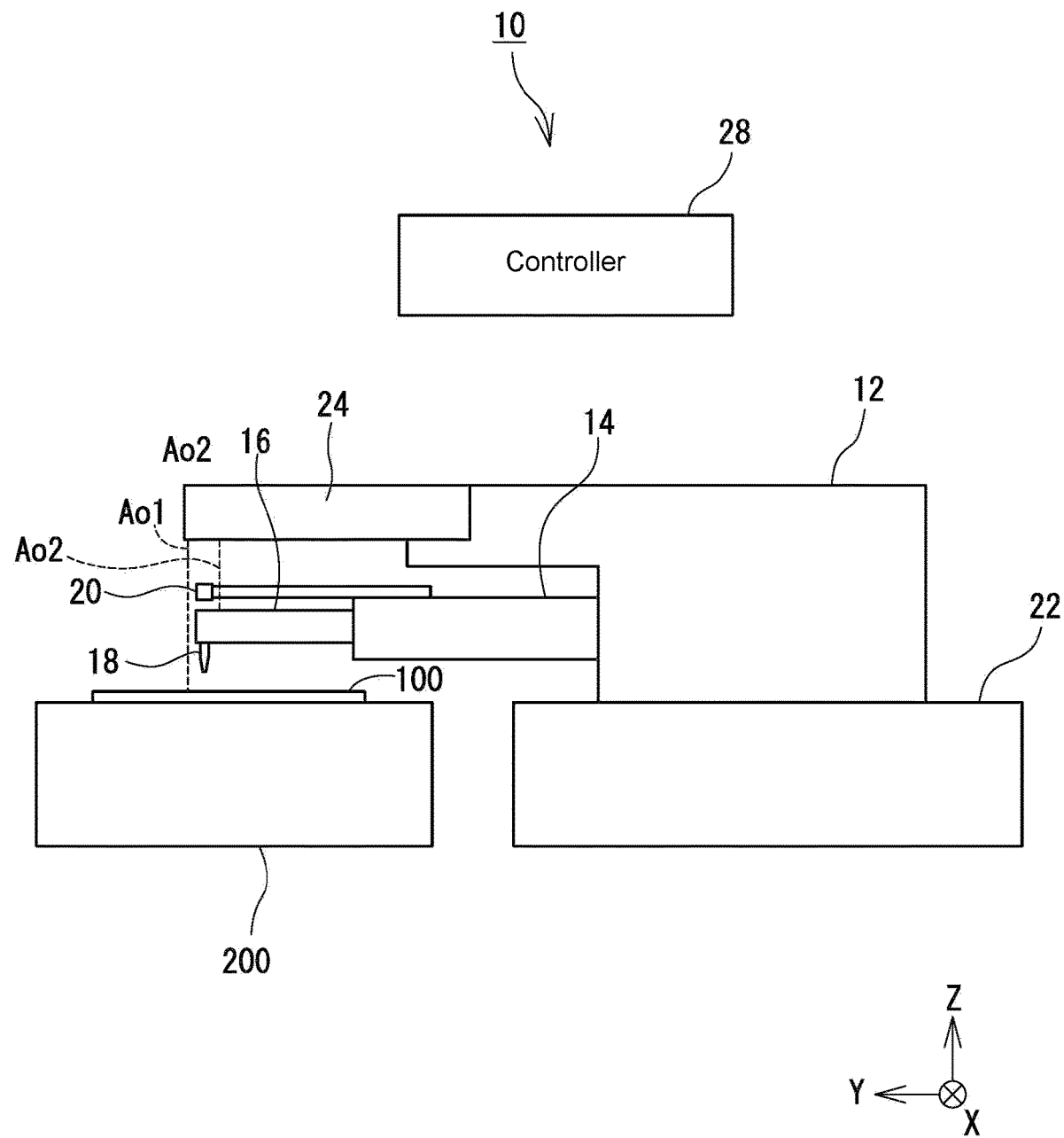
FIG. 1 illustrates a configuration of a wire bonding apparatus which is a kind of manufacturing apparatus of a semiconductor device.
Figure 2:
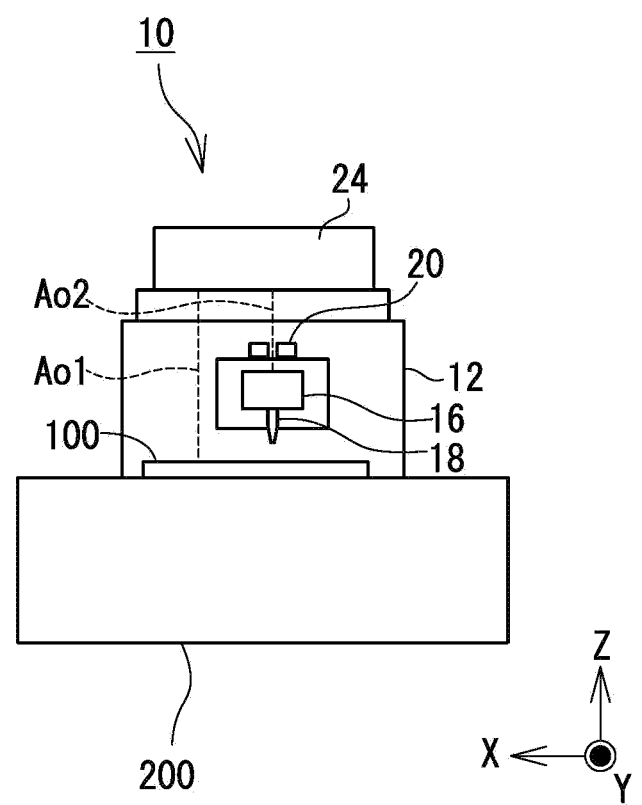
FIG. 2 illustrates a wire bonding apparatus as viewed from a different angle from that of FIG. 1.

Hereinafter, a configuration of a manufacturing apparatus of a semiconductor device will be described with reference to the drawings. FIG. 1 and FIG. 2 illustrate a configuration of a wire bonding apparatus 10 which is a kind of manufacturing apparatus of a semiconductor device.

The wire bonding apparatus 10 manufactures a semiconductor device by connecting two electrodes provided on a workpiece 100 with a conductive wire. The workpiece 100 is, for example, a lead frame on which a semiconductor chip is mounted. In general, the semiconductor chip and the lead frame are respectively provided with electrodes, and the semiconductor device is manufactured by electrically connecting these electrodes with the wire. The workpiece 100 like this is mounted on a stage 200.

The wire bonding apparatus 10 has a bonding head 12 assembled to an XY stage 22. The XY stage 22 moves the bonding head 12 in a horizontal direction, that is, in an X direction and a Y direction. An ultrasonic horn 16 is attached to the bonding head 12 so as to be movable in a vertical direction (that is, a Z direction). The ultrasonic horn 16 is attached to the bonding head 12 via a horn holder 14. The ultrasonic horn 16 generates ultrasonic vibrations and propagates them to a capillary 18. The capillary 18 is a tubular member attached to an end of the ultrasonic horn 16 and has a wire inserted therethrough. The capillary 18 functions as a tool that performs predetermined processing on the workpiece 100. The ultrasonic vibrations are transmitted to the wire via the capillary 18. Further, above the capillary 18, a clamper 20 is provided that moves together with the capillary 18 and clamps the wire.

An optical mechanism 24 moves together with the capillary 18. The optical mechanism 24 includes a first imaging unit and a second imaging unit, and a specific configuration thereof will be described later. A controller 28 controls driving of each part constituting the wire bonding apparatus 10. For example, the controller 28 positions the capillary 18 and calculates a positioning correction amount based on an image obtained by the optical mechanism 24, which will be described later.

Figure 3:
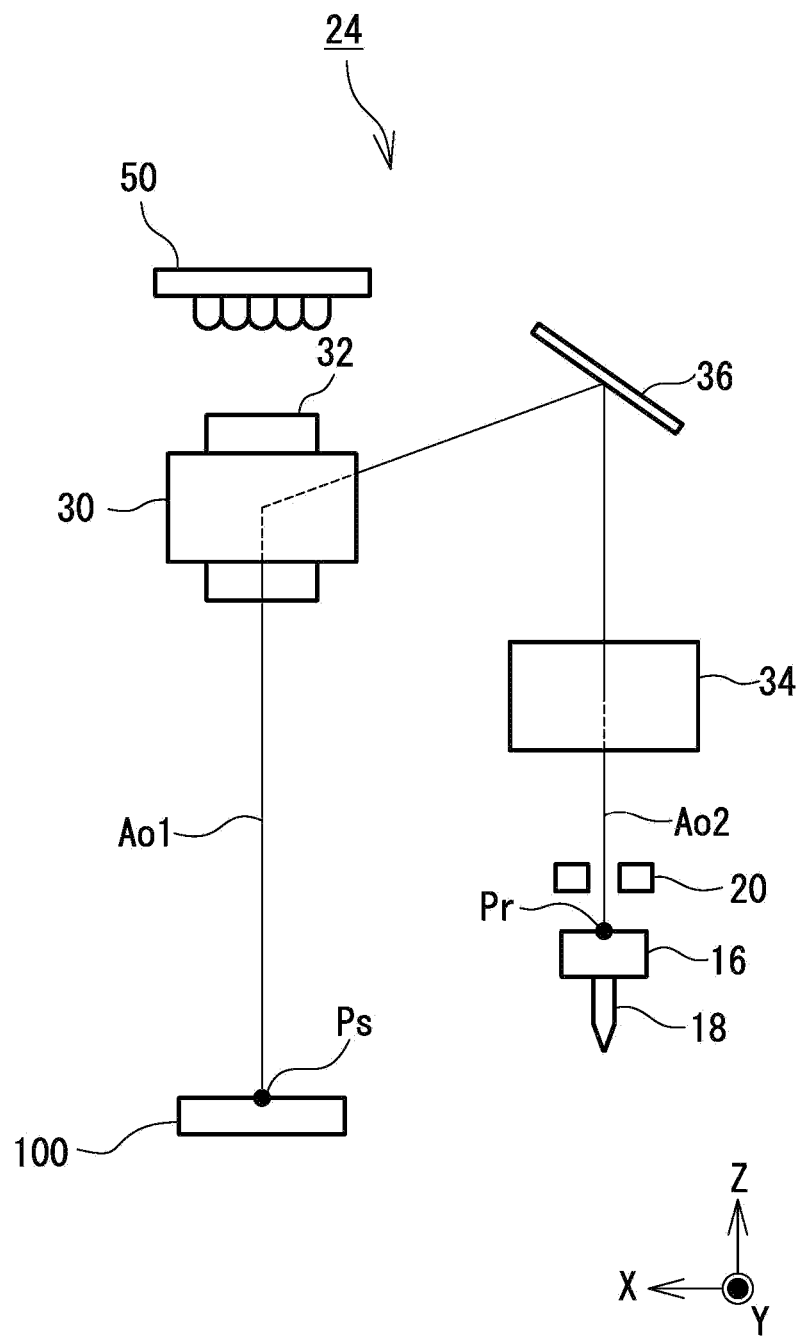
FIG. 3 illustrates a configuration of an optical mechanism.
Figure 4:
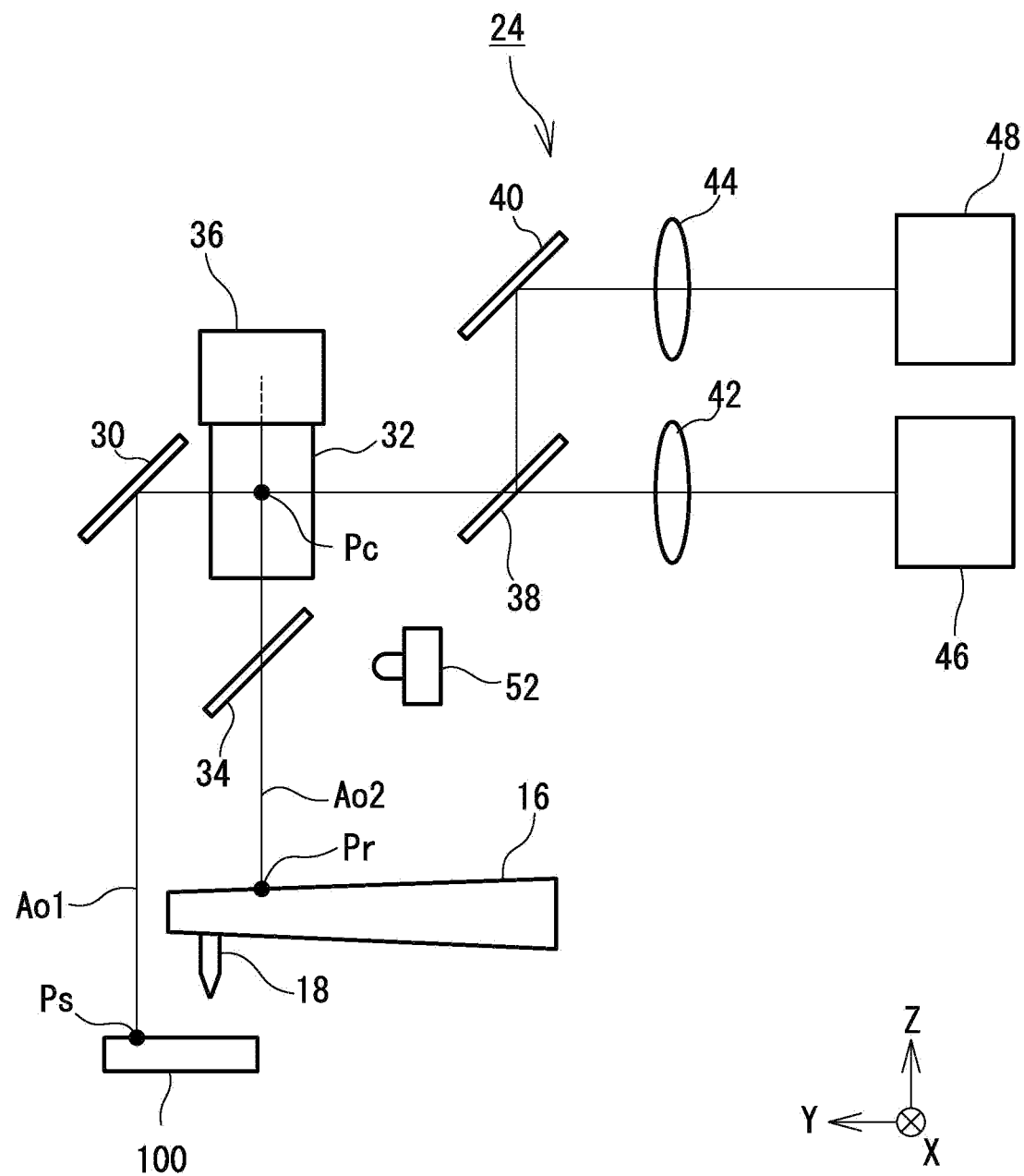
FIG. 4 illustrates the optical mechanism of FIG. 3 as viewed from a different angle from that of FIG. 3.

Next, a configuration of the optical mechanism 24 is described in detail. FIG. 3 and FIG. 4 illustrate a configuration of the optical mechanism 24. As described above, the optical mechanism 24 includes the first imaging unit and the second imaging unit. In this example, the first imaging unit and the second imaging unit share some of their components.

The first imaging unit is a unit that acquires a first image obtained by imaging a standard point Ps being at least a part of the workpiece 100. The standard point Ps is not particularly limited if it is a point indicating a specific position on the workpiece 100. Accordingly, the standard point Ps may be, for example, a corner of a chip provided on the workpiece 100. The number of the standard point Ps is not limited to one, and may be plural.

The first imaging unit includes two imaging elements 46, 48, two lenses 42, 44, a first optical element group that guides light from the standard point Ps to the imaging elements 46, 48, and a first illumination 50. Both the imaging element 46 of high magnification and the imaging element 48 of low magnification are imaging elements including a charge coupled device (CCD), a complementary metal oxide semiconductor (CMOS) or the like. The lens 42 of high magnification and the lens 44 of low magnification are disposed in front of the imaging elements 46 and 48.

The first optical element group includes a first half mirror 30, a second half mirror 32, a fifth half mirror 38, and a sixth mirror 40. The first half mirror 30 has a reflecting surface inclined by about 45 degrees with respect to the Z direction and the Y direction. The first half mirror 30 bends the light from the standard point Ps located directly below in the Z direction toward the Y direction, and transmits the light of the first illumination 50 disposed on an upper side of the first half mirror 30 in the Z direction. In the following, field light incident on the first half mirror 30 from the standard point Ps is referred to as "first field light". A vertical axis passing through the center of the first half mirror 30 is referred to as a "first optical axis Ao1".

The second half mirror 32 has a reflecting surface inclined by about 45 degrees with respect to the X direction and the Y direction. The second half mirror 32 transmits the first field light and bends later-described second field light toward the Y direction. The fifth half mirror 38 has a reflecting surface inclined by about 45 degrees with respect to the Z direction and the Y direction, and branches the first field light and the second field light in the Y direction and the Z direction. The first field light and the second field light transmitted through the fifth half mirror 38 and traveling in the Y direction, after having passed through the lens 42 of high magnification, reach the imaging element 46 of high magnification and are imaged.

The sixth mirror 40 has a reflecting surface inclined by about 45 degrees with respect to the Z direction and the Y direction, and bends the first field light and the second field light traveling from the fifth half mirror 38 in the Z direction toward the Y direction. The first field light and the second field light reflected by the sixth mirror 40 and traveling in the Y direction, after having passed through the lens 44 of low magnification, reach the imaging element 48 of low magnification and are imaged.

The first illumination 50 is an illumination disposed directly above the first half mirror 30 in the Z direction in order to illuminate the standard point Ps. By lighting up the first illumination 50, the standard point Ps is illuminated, and imaging of the standard point Ps at the imaging elements 46 and 48 is enabled.

Here, as described above, an image of the standard point Ps imaged by the imaging elements 46 and 48 is the "first image". A center point of the first half mirror 30 corresponds to a center point of the first image and thus the first optical axis Ao1. The controller 28 stores a horizontal positional deviation between the first optical axis Ao1 and a central axis of the capillary 18 as a bonding offset BO (Xbo, Ybo). The controller 28 executes positioning of the capillary 18 with respect to the workpiece 100 based on the first image and the bonding offset BO, which will be described later.

Next, the second imaging unit is described. The second imaging unit is a unit that acquires a second image obtained by imaging a reference point Pr. The reference point Pr is a point formed at a predetermined distance from the capillary 18, in other words, a point whose relative positional relationship with the capillary 18 can be regarded as constant. The controller 28 calculates a positioning correction amount based on the second image, which will be described later. In this example, one point on an upper surface of the ultrasonic horn 16 is imaged as the reference point Pr, which will also be described later.

The second imaging unit includes two imaging elements 46, 48, two lenses 42, 44, a second optical element group that guides light from the reference point Pr to the imaging elements 46, 48, and a second illumination 52. The imaging element 46 of high magnification, the imaging element 48 of low magnification, the lens 42 of high magnification and the lens 44 of low magnification are the same as those of the first imaging unit.

The second optical element group includes a third half mirror 34, a fourth mirror 36, the second half mirror 32, the fifth half mirror 38, and the sixth mirror 40. The third half mirror 34 has a reflecting surface inclined by about 45 degrees with respect to the Z direction and the Y direction. The third half mirror 34 transmits the light from the reference point Pr located directly below in the Z direction, bends the light from the second illumination 52 and guides the light to the reference point Pr. In the following, field light incident on the third half mirror 34 from the reference point Pr is referred to as "second field light". A vertical axis passing through the center of the third half mirror 34 is referred to as a "second optical axis Ao2".

The fourth mirror 36 has a reflecting surface inclined in the X direction and the Z direction. The fourth mirror 36 bends the second field light transmitted through the third half mirror 34 and traveling in the Z direction toward the second half mirror 32 side. The second field light reflected by the third half mirror 34 is reflected by the second half mirror 32 and travels in the Y direction and toward the fifth half mirror 38 side. After that, similarly to the first field light, the second field light is branched into a high magnification side and a low magnification side by the fifth half mirror 38, and is imaged by the corresponding imaging elements 46 and 48.

The second illumination 52 is an illumination disposed on the Y direction side as viewed from the third half mirror 34 in order to illuminate the reference point Pr. By lighting up the second illumination 52, the reference point Pr is illuminated, and imaging of the reference point Pr at the imaging elements 46 and 48 is enabled. The controller 28 images only one of the standard point Ps and the reference point Pr by switching an illumination for lighting from the first illumination 50 and the second illumination 52. In other words, the first illumination 50 and the second illumination 52 function as a field-of-view switching means of switching the imaging target to either the standard point Ps or the reference point Pr. By providing such a field-of-view switching means, both the first image (image obtained by imaging the standard point Ps) and the second image (image obtained by imaging the reference point Pr) can be obtained by one imaging element. As the field-of-view switching means, a shutter may be provided on an optical path of each of the first field light and the second field light. In some cases, the field-of-view switching means may not be provided. In this case, since the first field light and the second field light are simultaneously incident on the imaging elements 46 and 48, an image can be obtained in which both the standard point Ps and the reference point Pr are both reflected. The image in which the standard point Ps and the reference point Pr are both reflected is treated as the first image and as the second image at the same time.

As is clear from the description so far, a second optical path being the optical path of the second field light joins a first optical path being the optical path of the first field light at a time point when the second optical path reaches the second half mirror 32 from the reference point Pr. That is, in this example, the second half mirror 32 is a junction Pc where the first optical path and the second optical path join. In this example, optical elements are disposed so that an optical path length of the light from the standard point Ps until reaching the junction Pc is equal to an optical path length of the light from the reference point Pr until reaching the junction Pc. In other words, the optical path length of the first optical path and the optical path length of the second optical path are made equal. By such a configuration, focuses of the first field light and the second field light can be caused to coincide with each other.

Next, positioning of the capillary 18 and calculation of a correction amount for the positioning are described. As described above, the controller 28 positions the capillary 18 with respect to the workpiece 100 based on the first image obtained by imaging the standard point Ps and the pre-stored bonding offset BO. Specifically, the controller 28 analyzes the first image obtained by imaging the standard point Ps, thereby finding a relative position between the standard point Ps and the first optical axis Ao1 in the horizontal direction, and adds the pre-stored bonding offset BO to the relative position, thereby calculating a position of the capillary 18 relative to the standard point Ps. Then, the controller 28 controls movement of the XY stage 22 so that the relative position between the capillary 18 and the standard point Ps becomes a desired value.

By the way, in such positioning, the value of the pre-stored bonding offset BO is utilized. However, the actual bonding offset BO changes from the stored value due to a temperature variation or the like. Hence, in the case of utilizing the value of the stored bonding offset BO as it is for positioning, a positioning error occurs.

Therefore, conventionally, there has been proposed to perform positioning correction that cancels a change in the bonding offset BO. For example, a technique is known in which a temperature sensor is provided on the bonding head 12 or the optical mechanism 24 or the like, and positioning correction is performed according to a detected temperature obtained. However, a temperature distribution in the bonding head 12 or the optical mechanism 24 or the like varies in a complex manner, and accordingly, a change amount of the bonding offset BO also varies in a complex manner. Hence, it is difficult to accurately correct the positioning only by the detected temperature.

In the present specification, the change amount of the bonding offset BO is calculated from the second image. That is, as described above, the second image is an image obtained by imaging the reference point Pr whose position relative to the capillary 18 can be regarded as constant. Hence, in the case where a relative positional relationship between the optical mechanism 24 and the capillary 18 varies and thus the bonding offset BO varies, the position of the reference point Pr in the second image 70 also varies. Therefore, the controller 28 calculates a change amount of the offset and thus the positioning correction amount based on a variation in the position of the reference point Pr in the second image 70.

Figure 5:
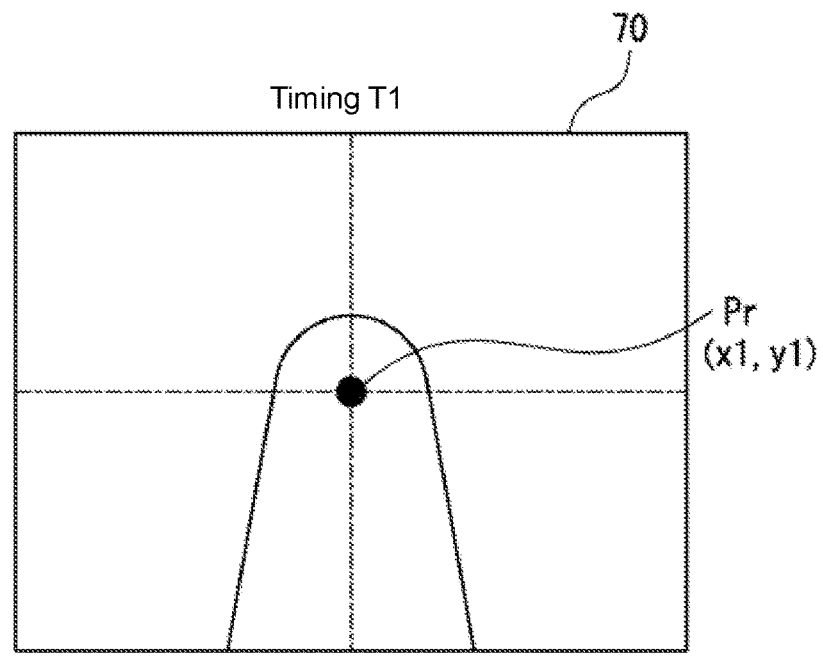
FIG. 5 is a conceptual diagram of a second image obtained by imaging at a timing T1 and a second image obtained by imaging at a timing T2 different from the timing T1.
Figure 5:
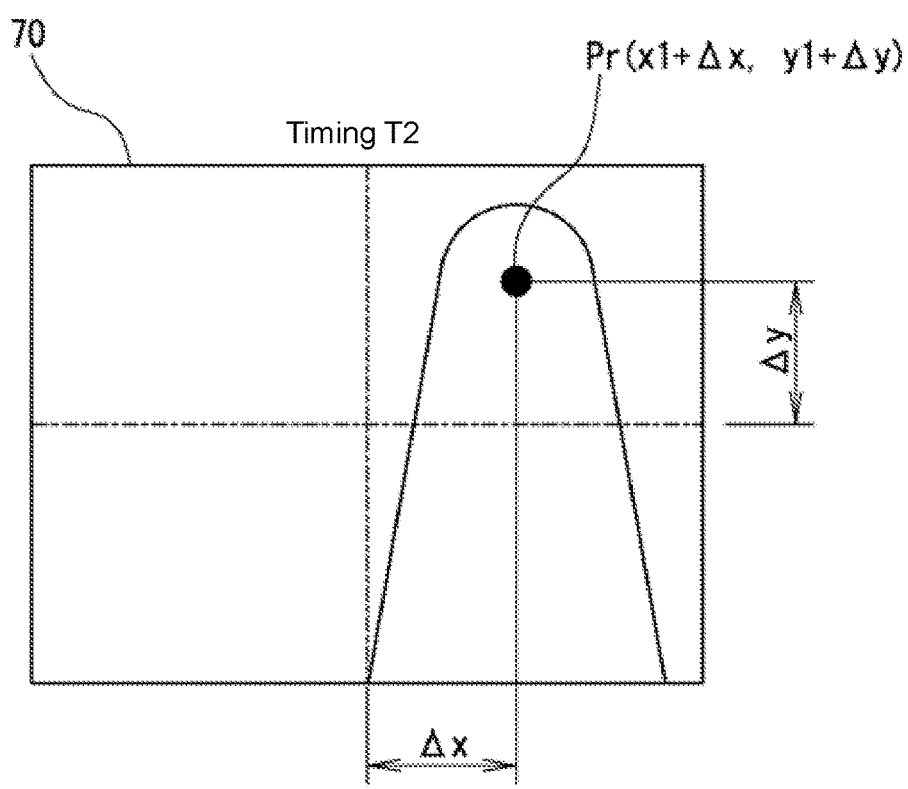

This is described with reference to FIG. 5. FIG. 5 is a conceptual diagram of a second image 70 obtained by imaging at a timing T1 and the second image 70 obtained by imaging at a timing T2 different from the timing T1. In FIG. 5, the timing T1 is immediately after activation of the wire bonding apparatus 10, and is a timing at which the bonding offset BO is maintained at a pre-stored value without change. At the timing T1, the reference point Pr is located at predetermined coordinates (x1, y1) in the second image 70. The timing T2 is a timing at which each part of the wire bonding apparatus 10 generates heat due to execution of bonding processing, and the actual value of the bonding offset BO varies from the stored value. At the timing T2, it is assumed that the coordinate values of the reference point Pr in the second image 70 deviate by $\Delta x$, $\Delta y$ from the timing T1 and have become coordinates (x1+$\Delta x$, y1+$\Delta y$). In this case, it can be determined that, the relative positional relationship between the optical mechanism 24 and the capillary 18, and thus the bonding offset BO, have varied by an amount corresponding to $\Delta x$, $\Delta y$ from the stored value. Therefore, when the controller 28 positions the capillary 18 at the timing T2, a value that cancels ($\Delta x$, $\Delta y$) is treated as the positioning correction amount, and the positioning of the capillary 18 is corrected.

In this way, by calculating the positioning correction amount based on the second image obtained by imaging the reference point Pr whose position is constant with respect to the capillary 18, a variation in the bonding offset BO can be accurately calculated and positioning accuracy of the capillary 18 can be improved as compared to the related art. When a relative positional relationship between the optical elements provided in the optical mechanism 24, particularly, the relative positional relationship between the optical elements (namely, the first half mirror 30, the second half mirror 32, the third half mirror 34, and the fourth mirror 36) located closer to the imaging target (the standard point Ps or the reference point Pr) than the junction Pc changes due to a temperature variation or the like, accuracy of the positioning correction amount is lowered.

Figure 6:
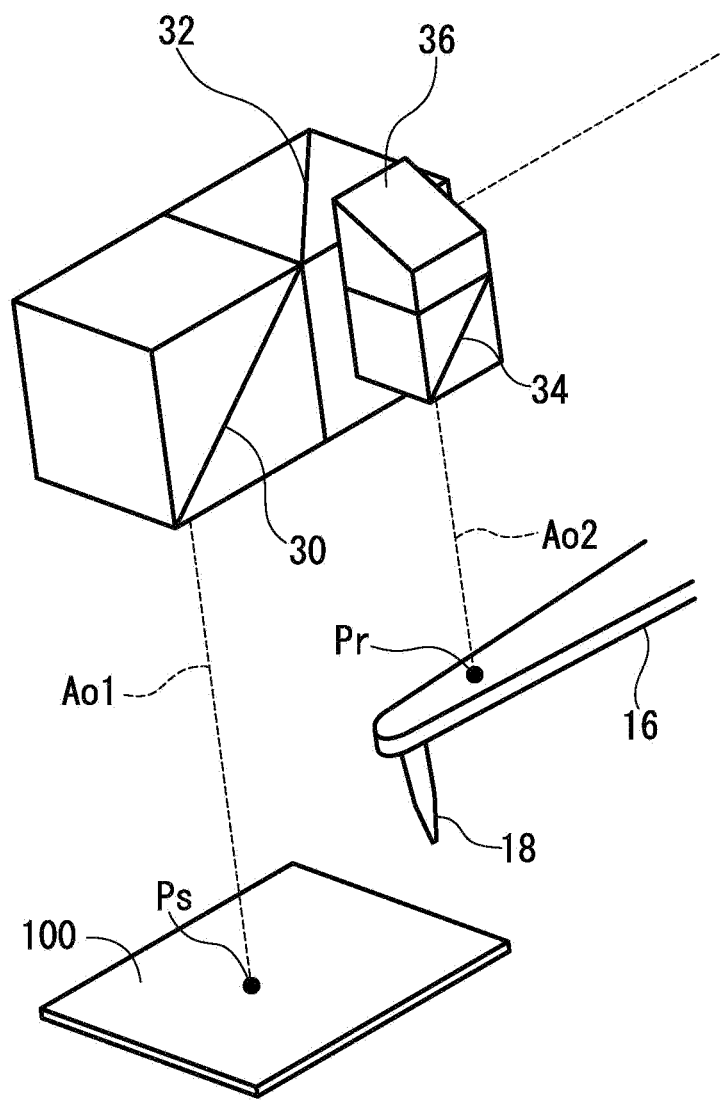
FIG. 6 is a perspective view illustrating an example of an optical element group.

Therefore, in order to suppress such a change in the relative positional relationship between the optical elements, multiple optical elements may be bonded and integrated with each other. For example, as shown in FIG. 6, prisms functioning as the first half mirror 30, the second half mirror 32, the third half mirror 34 and the fourth mirror 36 may be bonded and integrated with each other. By such a configuration, a change in the relative positional relationship between the optical elements can be suppressed to be small, and the accuracy of the positioning correction amount can be further improved.

Each of the optical elements 30, 32, 34, and 36 and brackets holding them may be made of a material having a small coefficient of linear expansion. A temperature sensor may be disposed in the vicinity of the optical elements 30, 32, 34 and 36. According to a detected temperature obtained, the positioning correction amount (the value that cancels Δx, Δy in the example of FIG. 5) calculated based on the second image 70 may be corrected. Since the optical elements 30, 32, 34 and 36 have few members interposed therebetween, a change amount in the relative position due to a temperature variation is small, or a variation mode thereof is relatively simple. Accordingly, even if the relative positional relationship between the optical elements 30, 32, 34 and 36 changes due to a temperature variation, correction can be performed with relatively high accuracy based on the detected temperature.

In any case, in this example, the reference point Pr whose position can be regarded as constant with respect to the capillary 18 is imaged by the optical mechanism 24, and a variation in the position of the reference point Pr with respect to the optical mechanism 24 is confirmed. Accordingly, positioning accuracy can be further improved. In this example, the second imaging unit that images the reference point Pr moves horizontally together with the first imaging unit, the bonding head 12, and the capillary 18. Hence, it is theoretically always possible to image the reference point Pr and thus calculate the positioning correction amount. In other words, according to the technique of this example, there is no need to temporarily suspend the bonding processing in order to obtain the positioning correction amount. As a result, according to the technique of this example, the number of semiconductor devices produced per unit time, so-called units per hour (UPH), can be improved.

Although it is theoretically always possible to image the reference point Pr, in reality, imaging of the reference point Pr is performed during a period during which the capillary 18 is stopped or moves at low speed. For example, imaging of the reference point Pr may be performed at a timing at which the workpiece 100 is replaced. Imaging of the reference point Pr may be performed during an execution period of wire bonding. For example, imaging of the reference point Pr may be performed during a discharge period during which discharging is performed in order to melt a tip of the wire, or during a search period during which the capillary 18 is lowered at low speed in order to search for a height position where the tip of the wire contacts an electrode provided on the workpiece 100.

Figure 7:
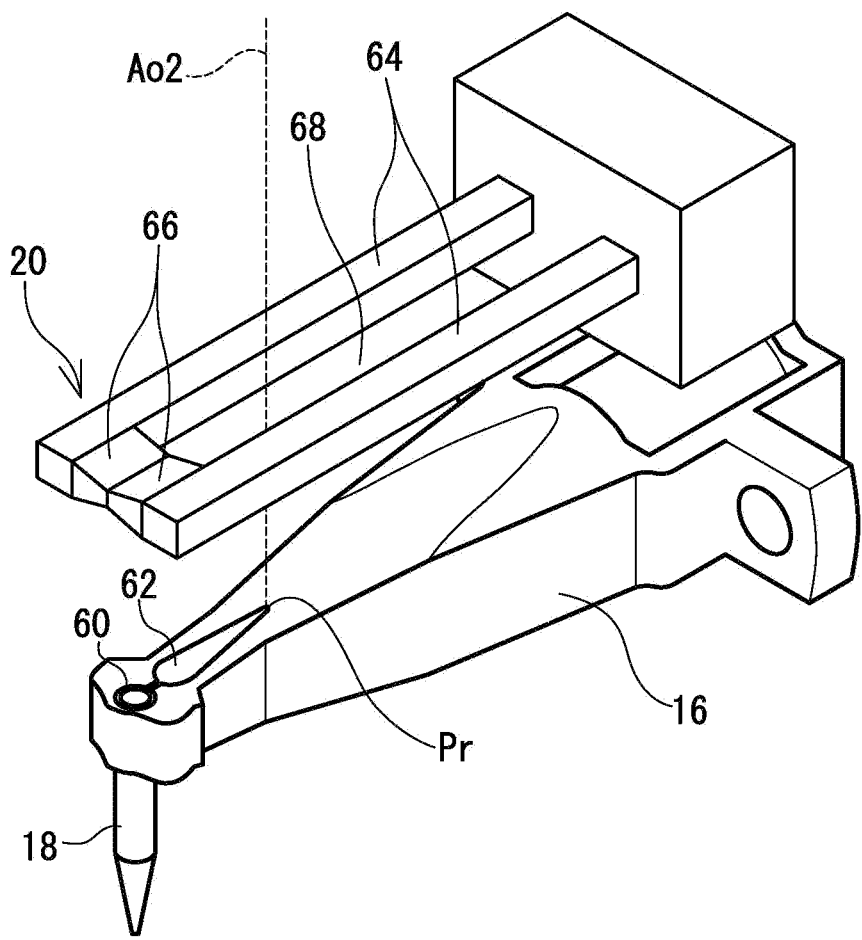
FIG. 7 is a perspective view illustrating an example of a reference point.

Next, the reference point Pr is described with reference to FIG. 7. As repeatedly described, the reference point Pr is not particularly limited if it is a point whose position with respect to the capillary 18 can be regarded as constant. In this example, as shown in FIG. 7, one point on the upper surface of the ultrasonic horn 16 holding the capillary 18 is defined as the reference point Pr.

More specifically, in the ultrasonic horn 16, an attachment hole 60 holding the capillary 18 and an adjustment hole 62 having a drop-like shape and partially connected to the attachment hole 60 are formed. The clamper 20 is disposed on the upper side of the ultrasonic horn 16. The clamper 20 has a pair of gripping arms 64 and a tip 66 provided at an end of each of the gripping arms 64. The tip 66 protrudes toward the other arm. Hence, a gap 68 to a certain extent is formed between the pair of gripping arms 64. The vicinity of the adjustment hole 62 on the upper surface of the ultrasonic horn 16 can be observed from the upper side through the gap 68. In this example, the apex of the drop-like shape of the adjustment hole 62 that can be observed through the gap 68 is treated as the reference point Pr. In this way, by treating a feature portion provided in the existing ultrasonic horn 16 as the reference point Pr, a design change from the existing ultrasonic horn 16 can be suppressed to a small extent. Since the adjustment hole 62 is provided in the vicinity of the attachment hole 60 and thus in the vicinity of the capillary 18, by utilizing a ridgeline of the adjustment hole 62 as the reference point Pr, a change in the relative positional relationship between the capillary 18 and the first optical axis Ao1 can be relatively accurately acquired.

In some cases, in the clamper 20, there is almost no gap 68 between the two gripping arms 64. In such a case, it is difficult to image the adjustment hole 62 by the second imaging unit. In that case, a member protruding horizontally outward from the clamper 20 may be attached to the ultrasonic horn 16, and a point on an upper surface of this protruding member may be treated as the reference point Pr.

Figure 8:
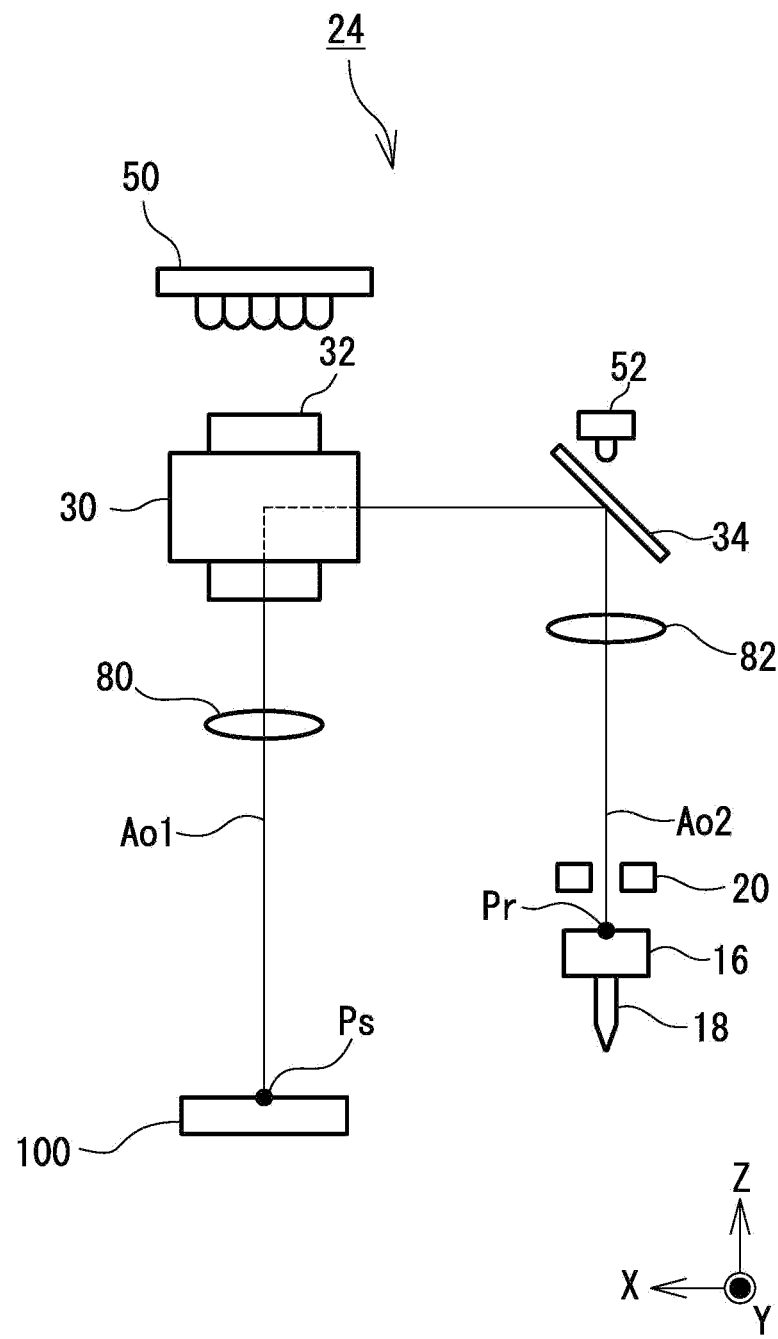
FIG. 8 illustrates a configuration of another optical mechanism.
Figure 9:
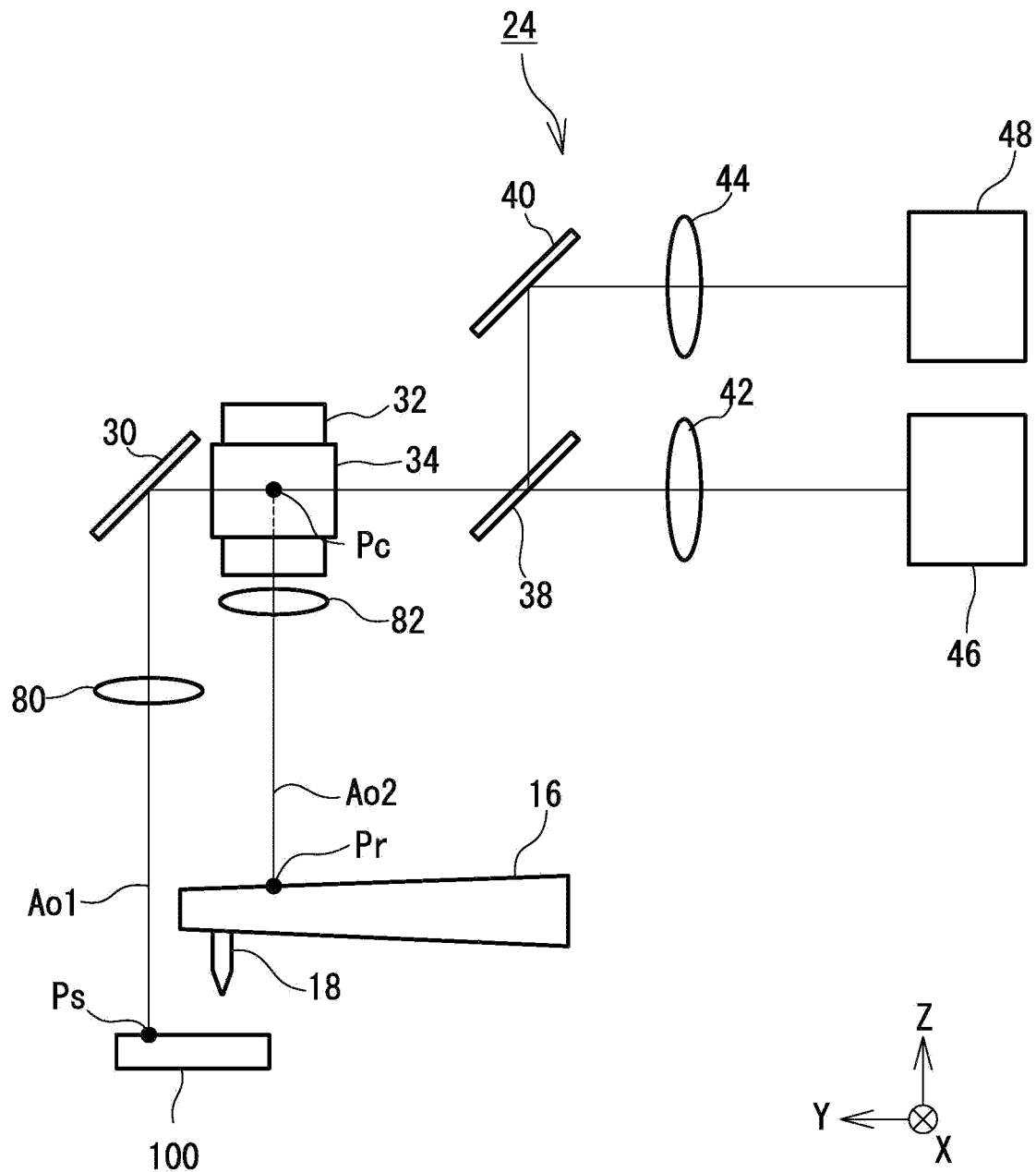
FIG. 9 illustrates the optical mechanism of FIG. 8 as viewed from a different angle from that of FIG. 8.

Next, other configuration examples of the optical mechanism 24 are described. FIG. 8 and FIG. 9 illustrate a configuration of another optical mechanism 24. In the above example, in order to cause the focuses of the first imaging unit and the second imaging unit to coincide with each other, the optical elements are disposed so that the optical path length of the first optical path and the optical path length of the second optical path are equal to each other. However, something else than the optical path length may be adjusted to cause the focuses to coincide. For example, in the optical path of at least one of the first imaging unit and the second imaging unit, a focus lens that adjusts the focus may be provided in a position closer to the imaging target (that is, the standard point Ps or the reference point Pr) than the junction Pc, and the focus may be adjusted by this focus lens. For example, in the example of FIG. 8 and FIG. 9, a first focus lens 80 is disposed directly below the first half mirror 30, and a second focus lens 82 is disposed directly below the third half mirror 34. By the two focus lenses 80 and 82, the focus in each imaging unit is adjusted. In this case, the fourth mirror 36 for adjusting the optical path length becomes unnecessary. In the example of FIG. 8 and FIG. 9, the third half mirror 34 is disposed so as to be inclined by about 45 degrees with respect to the X direction and the Z direction, and the second illumination 52 is disposed on the upper side of the third half mirror 34.

Although not illustrated, as another form, a movable focus lens may be disposed closer to an imaging element than the junction Pc. In this case, the position of the focus lens is changed and the focus is adjusted depending on whether imaging is performed by the first imaging unit or the second imaging unit. As another form, a liquid lens or the like whose curvature is variable may be used as one of the optical elements. In this case, the curvature of the liquid lens is changed and the focus is adjusted depending on whether imaging is performed by the first imaging unit or the second imaging unit. In addition, the focus may be adjusted by utilizing axial chromatic aberration.

Figure 10:
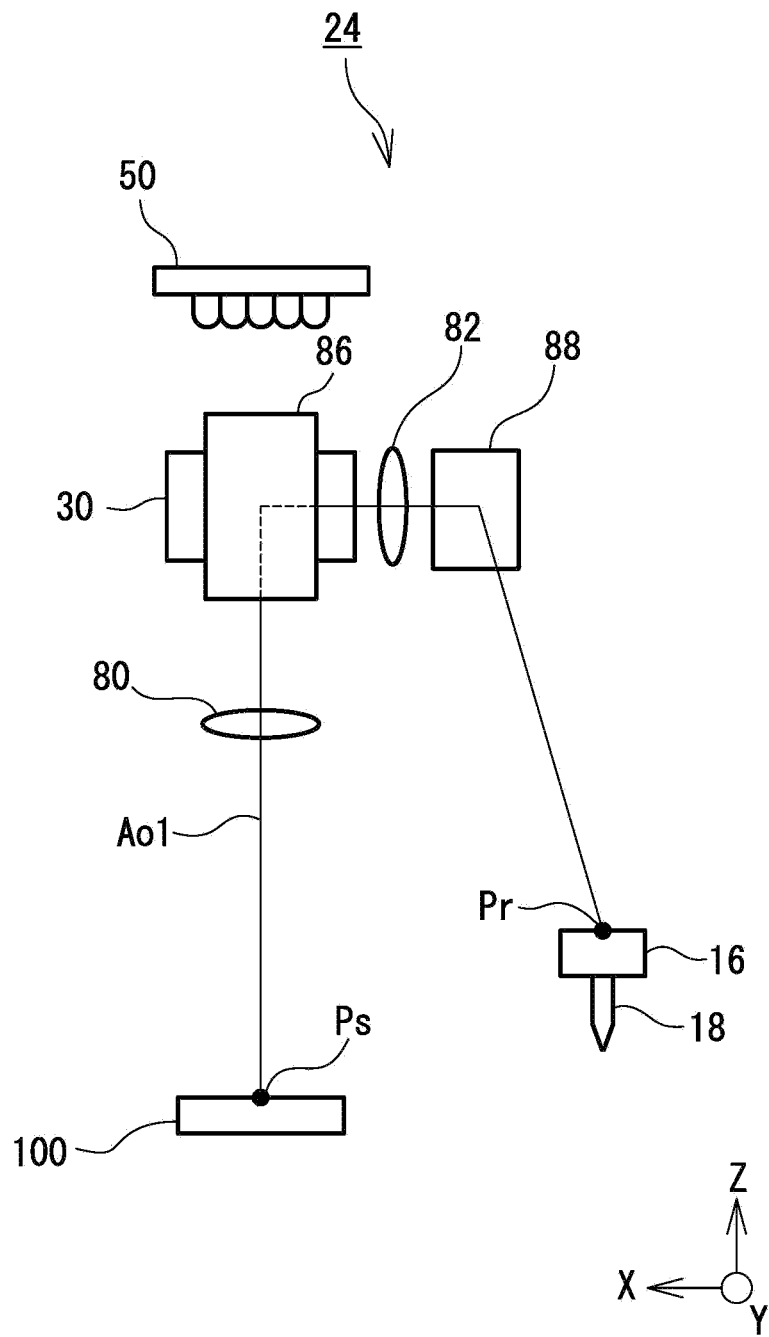
FIG. 10 illustrates a configuration of another optical mechanism.
Figure 11:
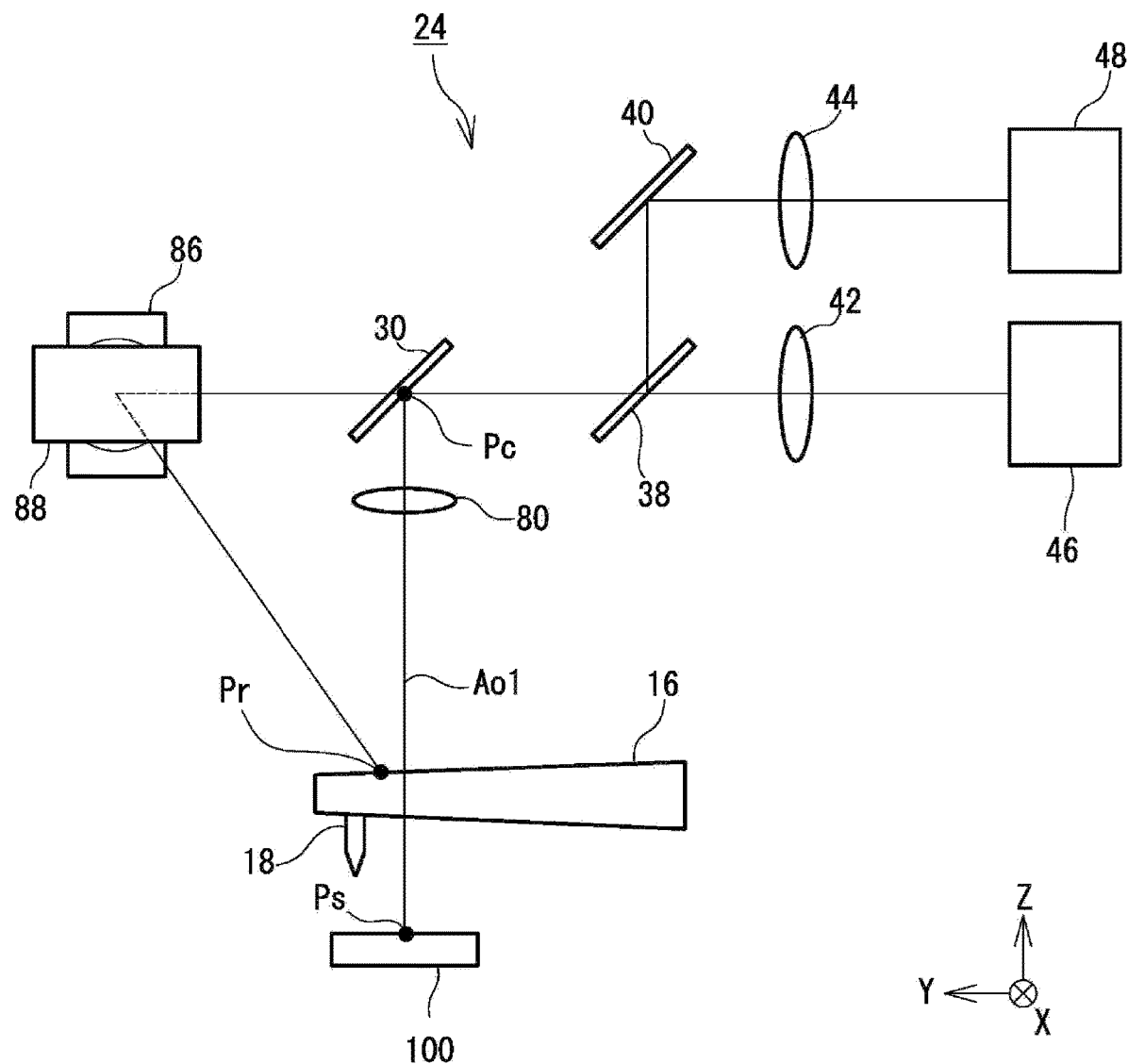
FIG. 11 illustrates the optical mechanism of FIG. 10 as viewed from a different angle from that of FIG. 10.

As another form, the second imaging unit may image the reference point Pr from an obliquely upper side instead of from directly above. For example, as shown in FIG. 10 and FIG. 11, the second imaging unit may image the reference point Pr provided on the upper surface of the ultrasonic horn 16 from the obliquely upper side. In the example of FIG. 10 and FIG. 11, the light from the reference point Pr reaches a seventh half mirror 86 disposed obliquely above the reference point Pr and is bent, and travels in the X direction. After that, the second field light passes through the second focus lens 82, is reflected by an eighth half mirror 88, and travels toward the first half mirror 30. Accordingly, in the example of FIG. 10 and FIG. 11, the first field light and the second field light join at the first half mirror 30. Both the first field light and the second field light after joining together are imaged by the imaging element 46 of high magnification and the imaging element 48 of low magnification.

Figure 12:
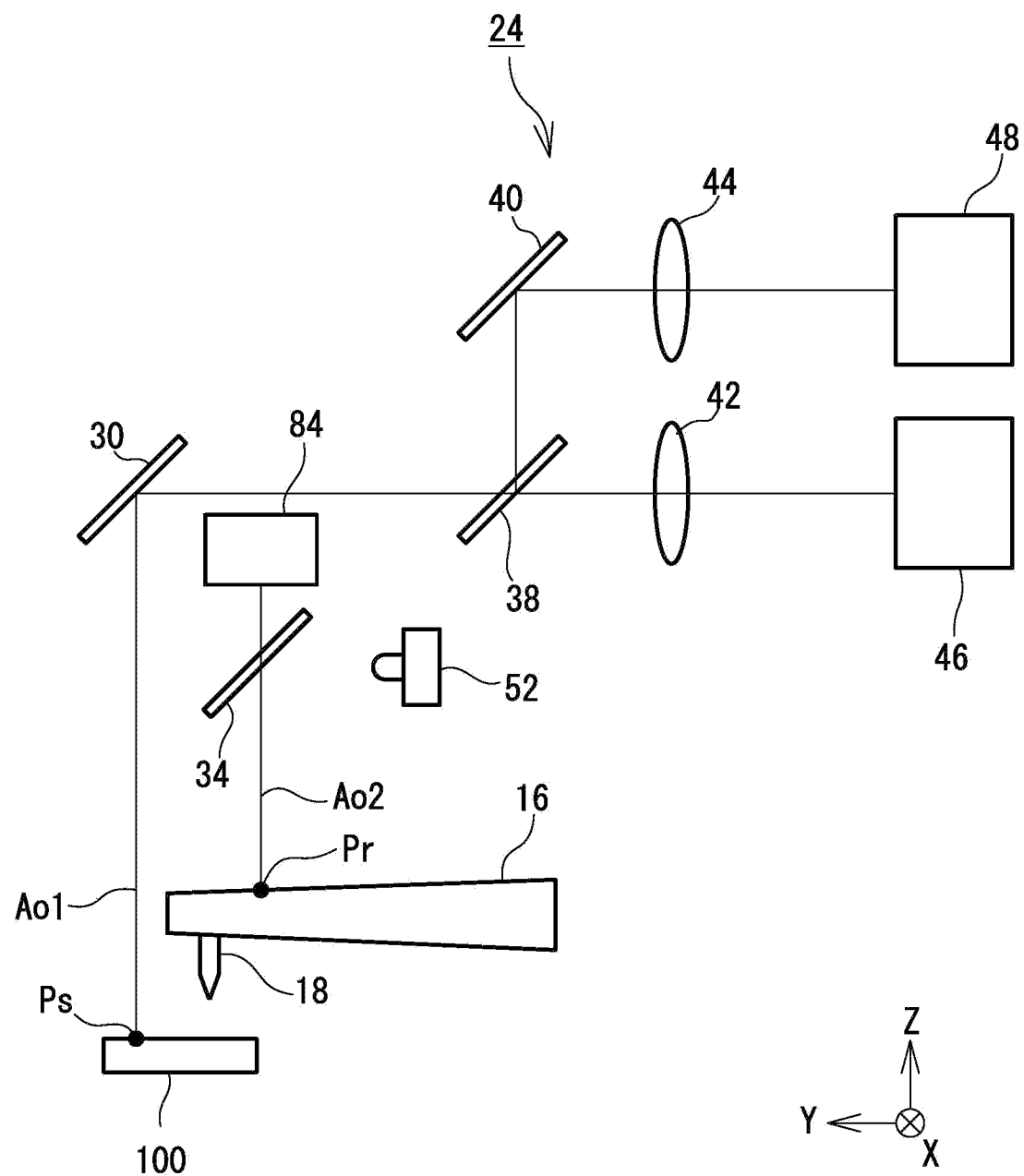
FIG. 12 illustrates a configuration of another optical mechanism.

In the description so far, the standard point Ps and the reference point Pr are imaged by the common imaging elements 46 and 48. However, in addition to the imaging elements 46 and 48 for positioning, an imaging element for positioning correction may be provided. For example, as shown in FIG. 12, a correction imaging element 84 may be disposed directly above the third half mirror 34, and the reference point Pr may be imaged by the correction imaging element 84.

Figure 14:
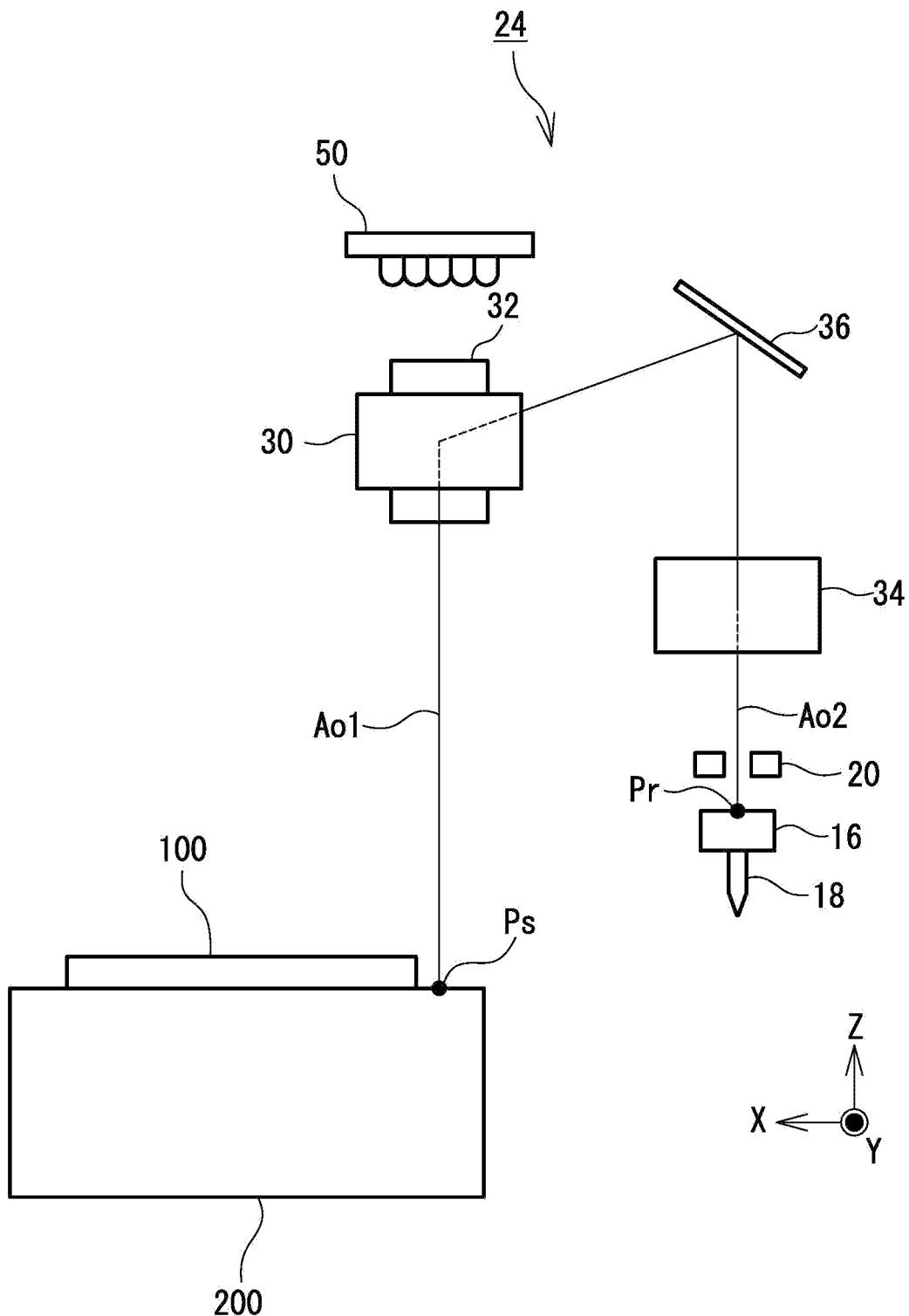
FIG. 14 is a perspective view illustrating an example of a standard point.

In the description so far, the standard point Ps is set to a specific position on the workpiece 100. However, as in FIG. 14, the standard point Ps is not necessarily provided on the workpiece 100 but may be provided on the stage 200. Further, the standard point Ps may be provided outside the stage 200.

Figure 13:
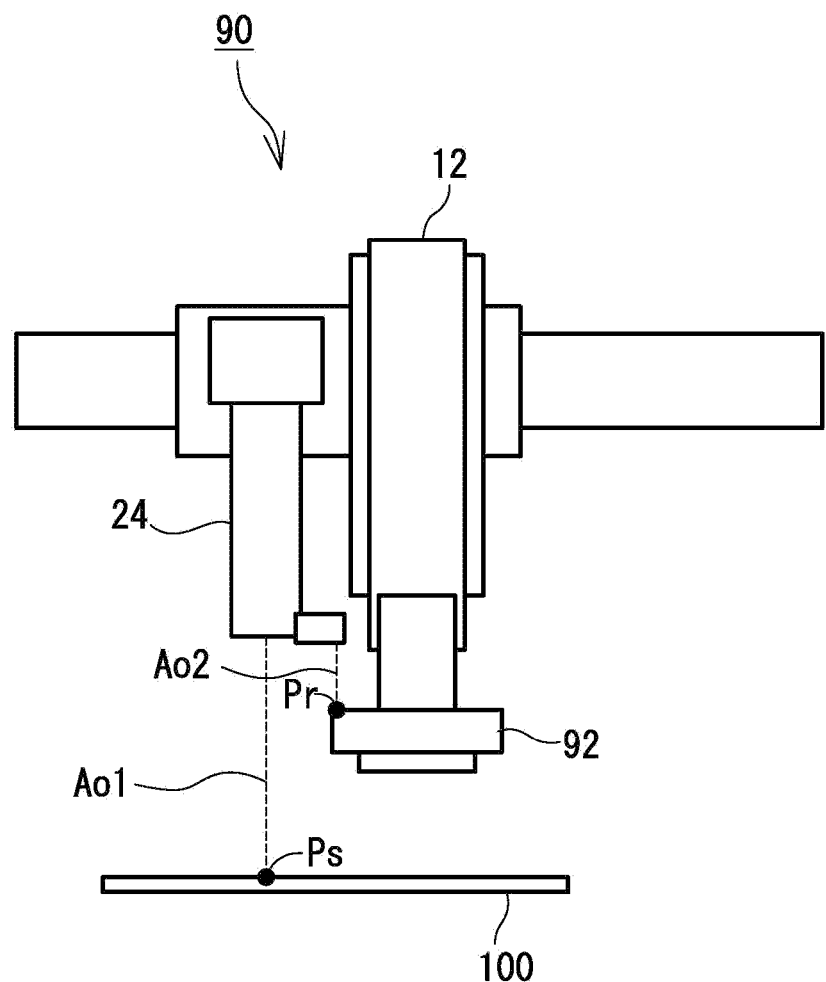
FIG. 13 illustrates a configuration of a die bonding apparatus.

In the description so far, the wire bonding apparatus 10 has been described as an example. However, the positioning correction technique disclosed in the present specification may be applied to other kinds of manufacturing apparatuses if they are manufacturing apparatuses that manufacture a semiconductor device. For example, the positioning correction technique disclosed in the present specification may be applied to a die bonding apparatus 90, as shown in FIG. 13. In this case, the die bonding apparatus 90 has a collet 92 and the optical mechanism 24 that moves together with the collet 92. The collet 92 suctions and holds a semiconductor chip and functions as a bonding tool. The optical mechanism 24 has multiple optical elements so that the standard point Ps provided on a substrate being the workpiece 100 and the reference point Pr set on an upper surface of the collet 92 can be imaged.

Similarly to the technique described above, a controller of the die bonding apparatus 90 positions the collet 92 with respect to the workpiece 100 based on the first image obtained by imaging the standard point Ps and the pre-stored bonding offset BO. The controller corrects the value of the bonding offset BO based on the second image obtained by imaging the reference point Pr.

Figure 15A:
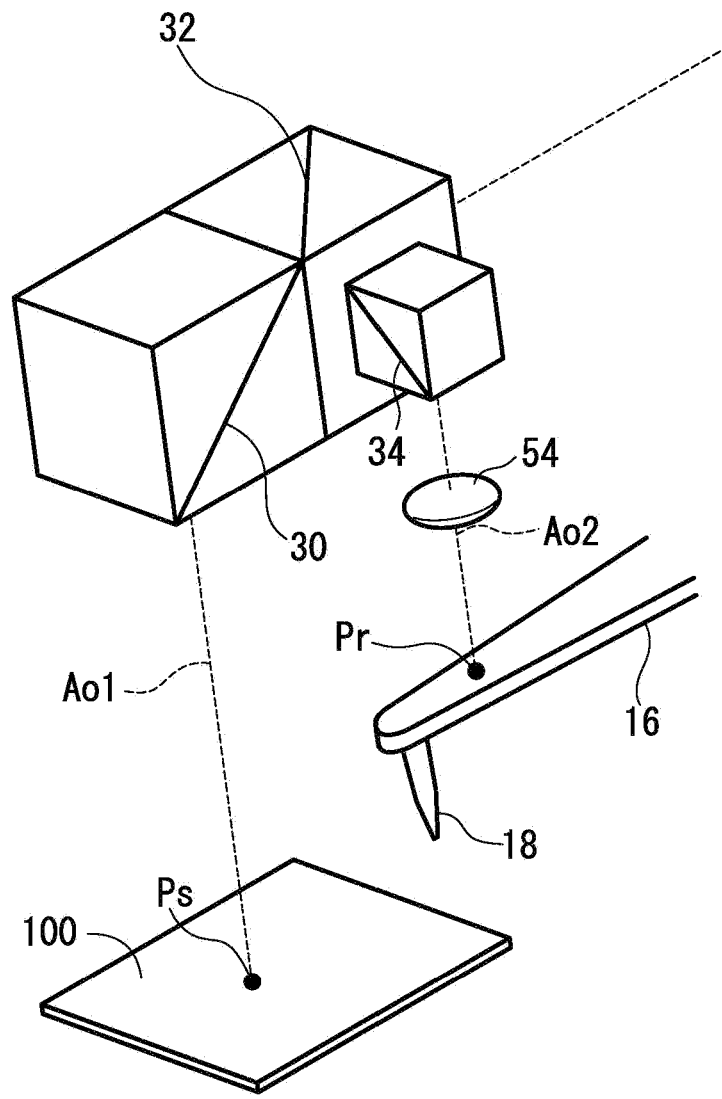
FIG. 15A is a perspective view illustrating an example of an optical element group.
Figure 15B:
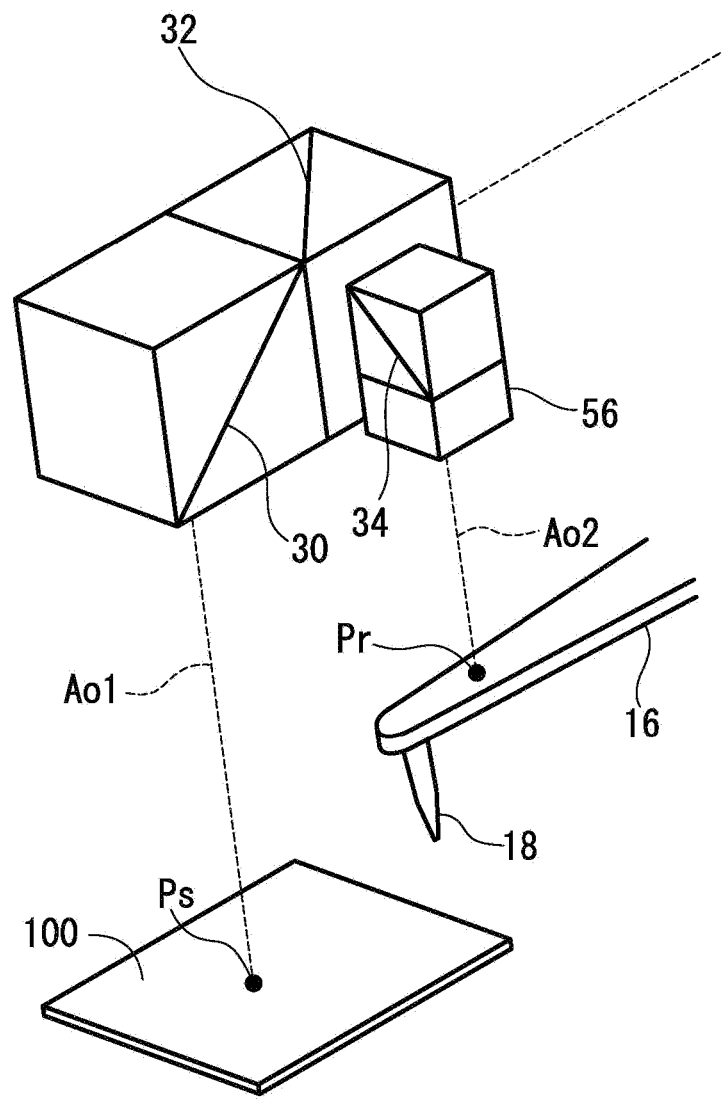
FIG. 15B is a perspective view illustrating an example of an optical element group.

As another embodiment, in order to adjust the optical path length of the second optical path, a lens 54 or a glass plate 56 may be inserted between the optical element 34 and the reference point Pr, as shown in FIG. 15A and FIG. 15B. Accordingly, the optical path length of the first optical path and the optical path length of the second optical path can be made equal, and both the standard point Ps and the reference point Pr can be focused.

DESCRIPTION OF REFERENCE NUMERALS

10: wire bonding apparatus; 12: bonding head; 14: horn holder; 16: ultrasonic horn; 18: capillary; 20: clamper; 22: XY stage; 24: optical mechanism; 28: controller; 30: first half mirror; 32: second half mirror; 34: third half mirror; 36: fourth mirror; 38: fifth half mirror; 40: sixth mirror; 42: lens of high magnification; 44: lens of low magnification; 46: imaging element of high magnification; 48: imaging element of low magnification; 50: first illumination; 52: second illumination; 54: lens; 56: glass plate; 60: attachment hole; 62: adjustment hole; 64: gripping arm; 66: tip; 68: gap; 70: second image; 80: first focus lens; 82: second focus lens; 84: correction imaging element; 86: seventh half mirror; 88: eighth half mirror; 90: die bonding apparatus; 92: collet; 100: workpiece; 200: stage; Ao1: first optical axis; Ao2: second optical axis; Pc: junction; Pr: reference point; Ps: standard point.

What is claimed is:

1. A manufacturing apparatus of a semiconductor device, comprising:
    a tool, performing predetermined processing on a workpiece and movable with respect to the workpiece;
    an optical mechanism, moving together with the tool; and
    a controller,
    wherein the optical mechanism comprises:
    a first imaging unit, acquiring a first image obtained by imaging a standard point set within an imaging range; and
    a second imaging unit, acquiring a second image obtained by imaging a reference point formed at a predetermined distance from the tool,
    wherein the controller positions the tool with respect to the workpiece based on the first image, and calculates a positioning correction amount of the tool based on the second image,
    the first imaging unit and the second imaging unit have an imaging element in common;
    the first imaging unit comprises a first optical element group that guides a first field light being light from the standard point to the imaging element;
    the second imaging unit comprises a second optical element group that guides a second field light being light from the reference point to the imaging element;
    a second optical path being an optical path of the second field light joins a first optical path being an optical path of the first field light at a junction located halfway from the reference point to the imaging element.

2. The manufacturing apparatus of a semiconductor device according to claim 1, wherein
    the controller executes imaging of the second image and calculation of the positioning correction amount during a period during which the tool is stopped or moves at low speed.

3. The manufacturing apparatus of a semiconductor device according to claim 2, wherein
    the tool is a capillary through which a wire is inserted in a wire bonding apparatus that connects electrodes provided on the workpiece with the wire;
    the controller executes the imaging of the second image and the calculation of the positioning correction amount during a discharge period during which discharging is performed in order to melt a tip of the wire, or during a search period during which the capillary is lowered at low speed in order to search for a height position where the tip of the wire contacts the electrodes.

4. The manufacturing apparatus of a semiconductor device according to claim 1, wherein
    the controller stores in advance a bonding offset, the bonding offset being an offset between a first optical axis being an optical axis of the first imaging unit, and the tool;
    the controller positions the tool based on coordinates of the standard point in the first image and the bonding offset, and calculates the positioning correction amount that cancels a change in the bonding offset based on a variation in coordinates of the reference point in the second image.

5. The manufacturing apparatus of a semiconductor device according to claim 1, wherein
the first imaging unit comprises a first illumination that illuminates the standard point;
the second imaging unit comprises a second illumination that illuminates the reference point;
the controller switches between the first illumination and the second illumination for lighting, thereby switching a field of view to be imaged by the imaging element.

6. The manufacturing apparatus of a semiconductor device according to claim 1, wherein
an optical path length of the first optical path is equal to an optical path length of the second optical path.

7. The manufacturing apparatus of a semiconductor device according to claim 1, wherein
at least one of the first imaging unit and the second imaging unit has one or more focus lenses disposed closer to an imaging target than the junction and adjusting a focus.

8. The manufacturing apparatus of a semiconductor device according to claim 1, wherein
among one or more optical elements constituting the first optical element group and one or more optical elements constituting the second optical element group, at least two optical elements are bonded and integrated with each other.

9. The manufacturing apparatus of a semiconductor device according to claim 1, wherein
the tool is a capillary through which a wire is inserted in a wire bonding apparatus that connects electrodes provided on the workpiece with the wire;
the manufacturing apparatus of a semiconductor device further comprises:
a horn, holding the capillary; and
a clamper, provided on the horn and having a pair of arms that grip the wire passing through the capillary,
wherein the reference point is a point on a surface of the horn and directly below a gap between the pair of arms.

10. A manufacturing method of a semiconductor device, manufacturing a semiconductor device by performing predetermined processing on a workpiece by a tool movable with respect to the workpiece, wherein the manufacturing method comprises:
imaging a standard point set within an imaging range and acquiring a first image by a first imaging unit movable together with the tool;
imaging a reference point formed at a predetermined distance from the tool and acquiring a second image by a second imaging unit movable together with the tool and the first imaging unit;
positioning the tool with respect to the workpiece based on the first image; and
calculating a positioning correction amount of the tool based on the second image,
wherein the first imaging unit and the second imaging unit have an imaging element in common;
the first imaging unit comprises a first optical element group that guides a first field light being light from the standard point to the imaging element;
the second imaging unit comprises a second optical element group that guides a second field light being light from the reference point to the imaging element;
a second optical path being an optical path of the second field light joins a first optical path being an optical path of the first field light at a junction located halfway from the reference point to the imaging element.

* * * * *